United States Patent
Li (10) Patent No.: US 10,860,154 B2
(45) Date of Patent: Dec. 8, 2020

(54) TOUCH DISPLAY PANEL, MANUFACTURING METHOD THEREOF, AND TOUCH DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Bo Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/336,110

(22) PCT Filed: Jan. 15, 2019

(86) PCT No.: PCT/CN2019/071788
§ 371 (c)(1),
(2) Date: Mar. 24, 2019

(87) PCT Pub. No.: WO2020/118845
PCT Pub. Date: Jun. 18, 2020

(65) Prior Publication Data
US 2020/0192525 A1    Jun. 18, 2020

(30) Foreign Application Priority Data

Dec. 14, 2018   (CN) .......................... 2018 1 1535068

(51) Int. Cl.
*G06F 3/045* (2006.01)
*G06F 3/044* (2006.01)
*H01L 27/32* (2006.01)

(52) U.S. Cl.
CPC .......... *G06F 3/0446* (2019.05); *G06F 3/0448* (2019.05); *H01L 27/323* (2013.01); *G06F 2203/04103* (2013.01)

(58) Field of Classification Search
CPC .... G06F 3/0446; G06F 3/0448; G06F 3/0412; G06F 3/044; G06F 2203/04111;
(Continued)

(56) References Cited

U.S. PATENT DOCUMENTS 9,870,111 B2 *   1/2018   Sugita ..................... G06F 3/044
9,904,383 B2 *   2/2018   Chen ....................... G06F 3/041
(Continued)

FOREIGN PATENT DOCUMENTS

CN   102654806 A   9/2012
CN   108509093 A   9/2018
(Continued)

*Primary Examiner* — Vijay Shankar
(74) *Attorney, Agent, or Firm* — Mark M. Friedman (57) ABSTRACT

The present invention provides a touch display panel, a manufacturing method of the touch display panel, and a touch display device. The touch display panel includes a flexible substrate and a metal mesh touch electrode layer. The metal mesh touch electrode layer is arranged on the flexible substrate, the metal mesh touch electrode layer includes multiple drive electrodes and multiple sensing electrodes. Multiple floating electrodes are disposed spaced apart from each other in each of the drive electrodes and each of the sensing electrodes. The floating electrodes are electrically insulated from the drive electrodes and the sensing electrodes and are placed in a layer the same as the drive electrodes and the sensing electrodes. Accordingly, interference signals from an organic light emitting diode layer are shielded and dispersed, and touch control sensibility is improved.

20 Claims, 6 Drawing Sheets

(58) Field of Classification Search
CPC . G06F 2203/04112; G06F 2203/04102; G06F 2203/04103
See application file for complete search history.

(56) References Cited

U.S. PATENT DOCUMENTS

| | | | |
|---|---|---|---|
| 10,126,859 B2 * | 11/2018 | Sugita | G06F 3/044 |
| 2018/0173346 A1 * | 6/2018 | Du | G06F 3/044 |
| 2019/0171322 A1 * | 6/2019 | Zhai | G09F 9/301 |
| 2019/0258343 A1 | 8/2019 | Hwang et al. | |

FOREIGN PATENT DOCUMENTS

| | | |
|---|---|---|
| CN | 108920010 A | 11/2018 |
| CN | 108984046 A | 12/2018 |
| JP | 2013171454 A | 9/2013 |

\* cited by examiner

TOUCH DISPLAY PANEL, MANUFACTURING METHOD THEREOF, AND TOUCH DISPLAY DEVICE

FIELD OF DISCLOSURE

The present invention relates to a field of display devices and in particular, to a touch display panel, a manufacturing method thereof, and a touch display device.

DESCRIPTION OF RELATED ART

In recent years, active matrix organic light emitting diode (AMOLED) display technology has been rapidly developed, and therefore touch control solutions have also been rapidly developed. At present, touch technology used in AMOLED displays is mainly categorized into two types, i.e., add-on type touch film bonding technology and on-cell type technology. Whether it is the add-on type or the on-cell type technology, there is a problem of an increased thickness of a product, which is not conducive to a narrow bezel design.

In the add-on type touch film bonding technology, a touch film is attached to the AMOLED display by using an optical clear adhesive (OCA). According to the actual product structure, the touch film can be placed above or below a polarizer, the bonding tolerance is generally 0.1 mm or more, and the number of bonding is increased, so the add-on type touch film bonding technology increases the thickness of the product, which is not conducive to the design of narrow-bezel products. In on-cell AMOLED touch technology, a touch sensing circuit is made on a packaging glass of a display, and then one side of the packaging glass is attached to the AMOLED display through a glass adhesive, so there is no need to separately attach an add-on type touch film. However, this structure is only suitable for making rigid AMOLED display screens, and an overall thickness of the product is thick, so it is not suitable for a current trend of thin and light electronic products.

Furthermore, in prior art, a touch sensing circuit is disposed on a thin film encapsulation (TFE) layer of an active-matrix organic light-emitting diode (AMOLED) display. Since a touch sensor is very close to a thin film transistor (TFT) layer, it is easily interfered by a TFT signal such as noises or other signals, thus causing touch control functions not to work properly and effectively.

SUMMARY

In prior art, a touch sensing circuit is disposed on a thin film encapsulation (TFE) layer of an active-matrix organic light-emitting diode (AMOLED) display. Since a touch sensor is very close to a thin film transistor (TFT) layer, it is highly susceptible to interference from a TFT signal such as noises or other signal interference, thus causing touch control functions not to work properly and effectively.

The present invention provides a touch display panel, a manufacturing method thereof, and a touch display device, which shield and disperse interference signals of the organic light emitting diode (OLED) layer, improve touch control sensitivity, and simplify a bonding process and reduce a thickness of an OLED product.

Accordingly, the present invention provides a touch display panel. The touch display panel comprises a flexible substrate and a metal mesh touch electrode layer. The metal mesh touch electrode layer is disposed on the flexible substrate. The metal mesh touch electrode layer comprises a plurality of drive electrodes and a plurality of sensing electrodes. A plurality of floating electrodes are disposed spaced apart from each other and located in each of the drive electrodes and each of the sensing electrodes, wherein the floating electrodes are electrically insulated from the drive electrodes and the sensing electrodes, and the floating electrodes are disposed in a layer the same as the drive electrodes and the sensing electrodes.

According to one embodiment of the present invention, the floating electrodes are linearly arranged at a specific angle in each of the drive electrodes and each of the sensing electrodes, and the specific angle is 45 degrees or 135 degrees.

According to one embodiment of the present invention, each of the floating electrodes is of an arc shape, a circular shape, a rectangular shape, or a hexagonal shape.

According to one embodiment of the present invention, a plurality of secondary floating electrodes are disposed inside each of the floating electrodes, and the secondary floating electrodes are disposed spaced apart from each other.

According to one embodiment of the present invention, a space between each of the drive electrodes and each of the sensing electrodes is provided with T-shaped interaction regions, L-shaped interaction regions, or pulse matrix interaction regions to increase a touch control contact area, and the T-shaped interaction regions, the L-shaped interaction regions or the pulse matrix interaction regions are respectively electrically connected to each of the drive electrodes and each of the sensing electrodes through at least two conductive through holes.

According to one embodiment of the present invention, a touch signal direction of the metal mesh touch electrode layer forms an included angle of 45 degrees with a gate signal line direction of the flexible substrate and a source/drain (SD) signal line direction of the flexible substrate.

According to one embodiment of the present invention, the touch display panel further comprises a substrate layer disposed on the flexible substrate and an insulating layer disposed on the substrate layer, wherein the metal mesh touch electrode layer comprises a first metal layer disposed on the substrate layer, a second metal layer disposed on the insulating layer, and a conductive through hole connected to the first metal layer and the second metal layer, and wherein the first metal layer and the second metal layer are arranged in different layers.

According to one embodiment of the present invention, the conductive through hole is defined in the insulating layer, and the second metal layer is electrically connected to the first metal layer through the conductive through hole, so that the drive electrodes and the sensing electrodes spaced apart from each other are electrically connected. The conductive through hole and the second metal layer are made of a same material.

According to one embodiment of the present invention, the flexible substrate comprises a flexible lining, an organic light emitting diode layer, and a thin film packaging layer sequentially stacked on each other; the organic light emitting diode layer comprises a plurality of sub-pixels disposed spaced apart from each other; a touch metal line of the metal mesh touch electrode layer is disposed between each adjacent two of the sub-pixels; and a width of the touch metal line ranges from 0.5 μm to 5 μm.

The present invention provides a touch display device, comprising:
 a touch display panel, comprising:
  a flexible substrate; and
  a metal mesh touch electrode layer disposed on the flexible substrate, the metal mesh touch electrode layer comprising a plurality of drive electrodes and a plurality of sensing electrodes, a plurality of floating electrodes disposed spaced apart from each other and located in each of the drive electrodes and each of the sensing electrodes, wherein the floating electrodes are electrically insulated from the drive electrodes and the sensing electrodes, and the floating electrodes are disposed in a layer the same as the drive electrodes and the sensing electrodes; and a protective layer disposed on the metal mesh touch electrode layer.

According to one embodiment of the present invention, the floating electrodes are linearly arranged at a specific angle in each of the drive electrodes and each of the sensing electrodes, and the specific angle is 45 degrees or 135 degrees.

According to one embodiment of the present invention, each of the floating electrodes is of an arc shape, a circular shape, a rectangular shape, or a hexagonal shape, a plurality of secondary floating electrodes are disposed inside each of the floating electrodes, and the secondary floating electrodes are disposed spaced apart from each other.

According to one embodiment of the present invention, a space between each of the drive electrodes and each of the sensing electrodes is provided with T-shaped interaction regions, L-shaped interaction regions, or pulse matrix interaction regions to increase a touch contact area; and the T-shaped interaction regions, the L-shaped interaction regions or the pulse matrix interaction regions are electrically connected to each of the drive electrodes and each of the sensing electrodes through at least two conductive through holes.

According to one embodiment of the present invention, the touch display panel further comprises a substrate layer disposed on the flexible substrate and an insulating layer disposed on the substrate layer; the metal mesh touch electrode layer comprises a first metal layer disposed on the substrate layer, a second metal layer disposed on the insulating layer, and a conductive through hole connected to the first metal layer and the second metal layer; the first metal layer and the second metal layer are arranged in different layers; the conductive through hole is defined in the insulating layer; the second metal layer is electrically connected to the first metal layer through the conductive through hole, so that the drive electrodes and the sensing electrodes spaced apart from each other are electrically connected; and the conductive through hole and the second metal layer are made of a same material.

According to one embodiment of the present invention, the flexible substrate comprises a flexible lining, an organic light emitting diode layer, and a thin film packaging layer sequentially stacked on each other; the organic light emitting diode layer comprises a plurality of sub-pixels disposed spaced apart from each other; a touch metal line of the metal mesh touch electrode layer is disposed between each adjacent two of the sub-pixels; and a width of the touch metal line ranges from 0.5 μm to 5 μm.

Furthermore, the present invention provides a manufacturing method of a touch display panel, comprising steps as follows:

S10: providing a flexible substrate; and

S20: forming a metal mesh touch electrode layer disposed on the flexible substrate, wherein the metal mesh touch electrode layer comprises a plurality of drive electrodes and a plurality of sensing electrodes; and a plurality of floating electrodes are disposed spaced apart from each other and located in each of the drive electrodes and each of the sensing electrodes;

wherein the floating electrodes are electrically insulated from the drive electrodes and the sensing electrodes, and the floating electrodes are disposed in a layer the same as the drive electrodes and the sensing electrodes.

According to one embodiment of the present invention, the manufacturing method of the touch display panel comprises steps as follows:

forming a substrate layer on the flexible substrate;

forming a first metal layer on the substrate layer;

forming an insulating layer on the first metal layer; and forming a second metal layer on the insulating layer, wherein the first metal layer and the second metal layer are arranged in different layers, and the drive electrodes and the sensing electrodes are formed in the second metal layer.

According to one embodiment of the present invention, when the second metal layer is formed, the second metal layer is etched to form a conductive through hole which connects the first metal layer and the second metal layer, so that the drive electrodes and the sensing electrodes are electrically connected.

According to one embodiment of the present invention, inside each of the floating electrodes are formed a plurality of secondary floating electrodes, and the secondary floating electrodes are disposed spaced apart from each other.

According to one embodiment of the present invention, a touch signal direction of the metal mesh touch electrode layer forms an included angle of 45 degrees with a gate signal line direction of the flexible substrate and a source/drain (SD) signal line direction of the flexible substrate.

The beneficial effects of the embodiments of the present invention: in a special metal mesh touch sensing circuit (ie, a touch sensing pattern), a touch signal direction forms an included angle of 45 degrees with a gate signal direction and a source/drain signal direction of the OLED layer. SD), thus minimizing overlapping among touch signals, gate signals, and source/drain signals. Therefore, the interference of driving signals of the touch OLED display panel on the touch signal can be minimized, thereby enhancing the stability and touch control sensitivity and realizing flexible display touch control functions.

In addition, the present invention utilizes a bridging metal with good conductivity and little optical influence on the OLED layer. Specifically, between the drive electrode and the sensing electrode is disposed, for example, T-shaped interaction regions. A double-M-shaped bridging metal for connection is used in the T-shaped interaction regions to electrically connect the drive electrodes and sensing electrodes isolated from and adjacent to each other. Thereby, a touch control sensing area between Tx and Rx is increased, the touch control sensing area is enlarged, the touch sensing signal is effectively enhanced, and the mutual capacitance touch function is realized. Furthermore, both the touch drive electrodes and the sensing electrodes are provided with floating electrodes of an arc shape, a circular shape, etc., and the floating electrodes are isolated from the drive electrodes and the sensing electrodes for shielding and dispersing interference signals of the OLED layer, effectively controlling the capacitance values, shielding and dispersing the interference signals of the OLED layer, and improving the touch control sensitivity.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

References to "embodiments" in the detailed description mean that the specific features, structures or characteristics described in connection with the embodiments may be included in at least one embodiment of the invention. The same terms mentioned in different places in the specification are not necessarily limited to the same embodiment, but should be understood as independent or alternative embodiments to other embodiments. In view of the technical solutions disclosed in the embodiments of the present invention, those skilled in the art should understand that the embodiments described herein may have other combinations or modifications in accordance with the embodiments of the present invention.

Figure 1:
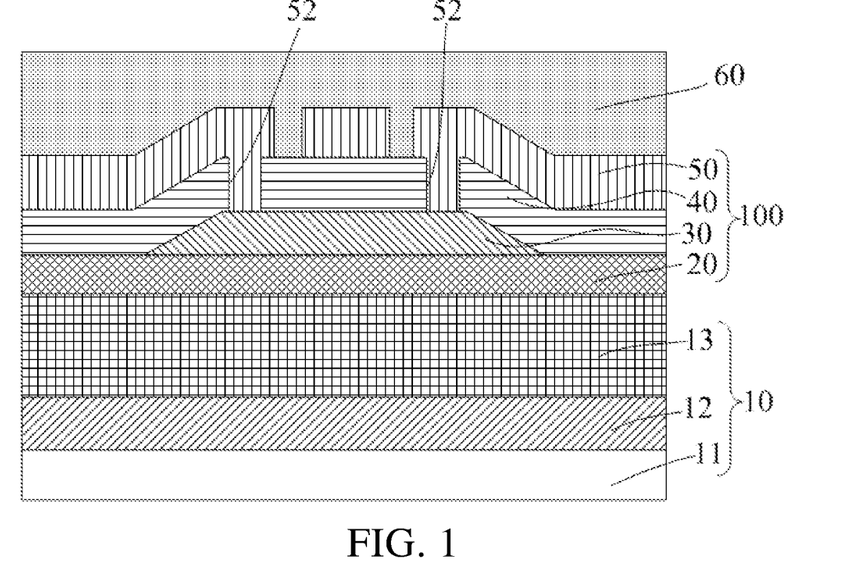
FIG. 1 is a cross-sectional structural view showing a touch display panel and a touch display device according to the present invention.
Figure 2:
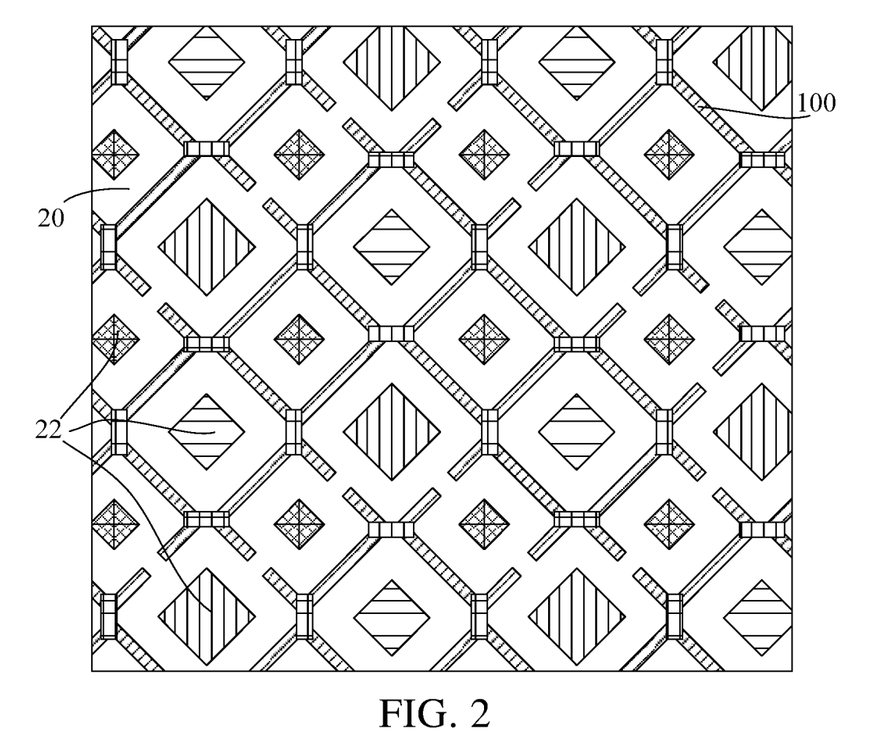
FIG. 2 is schematic view illustrating that a plurality of sub-pixels are disposed in a metal mesh touch electrode layer according to the present invention.
Figure 3:
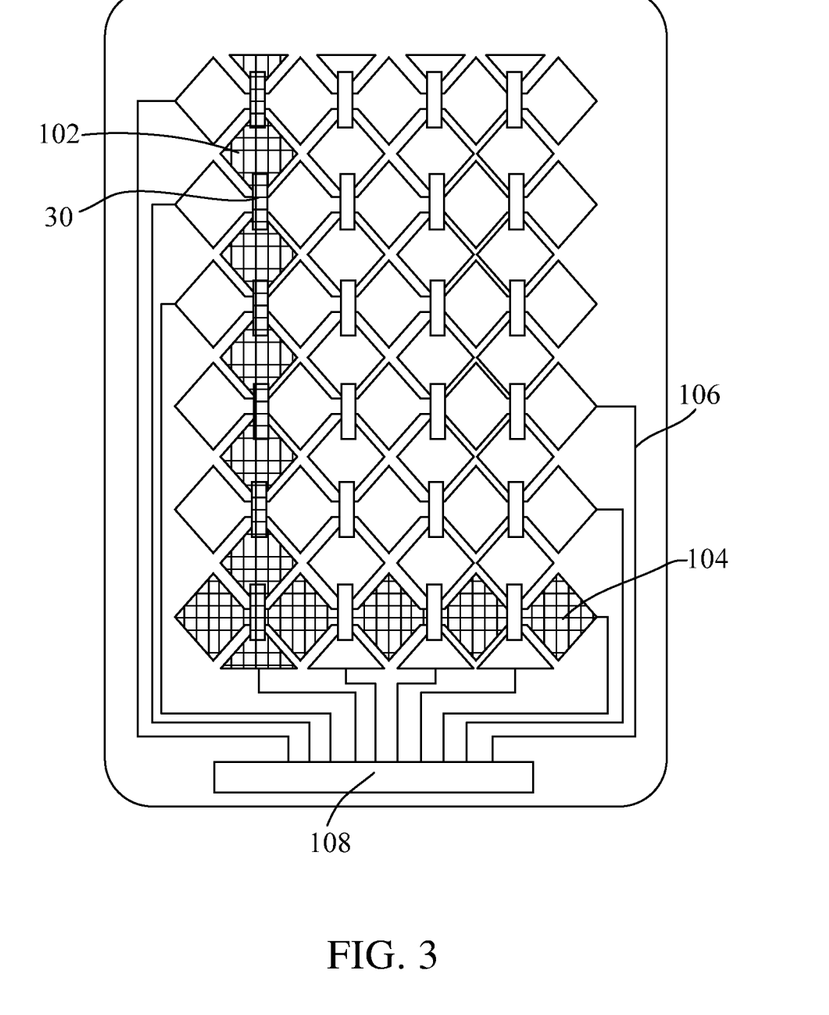
FIG. 3 is a schematic view illustrating that drive electrodes and sensing electrodes are connected through metal lines according to the present invention.

Referring to FIGS. 1 to 3, the present invention provides a touch display panel. The touch display panel comprises a flexible substrate 10 and a metal mesh touch electrode layer 100. The touch display panel referred to herein is used in, but not limited to, an active matrix organic light emitting diode (AMOLED) display, a smart phone, a tablet computer, or other suitable electronic devices.

The metal mesh touch electrode layer 100 is disposed on the flexible substrate 10. The metal mesh touch electrode layer 100 comprises a plurality of drive electrodes (Tx) 102 and a plurality of sensing electrodes (Rx) 104. A plurality of floating electrodes 103 are disposed spaced apart from each other and located in each of the drive electrodes 102 and each of the sensing electrodes 104. The floating electrodes 103 are electrically insulated from the drive electrodes 102 and the sensing electrodes 104, and the floating electrodes 103 are disposed in a layer the same as the drive electrodes 102 and the sensing electrodes 104.

In the embodiment shown in FIG. 1, the touch display panel further comprises a substrate layer 20 disposed on the flexible substrate 10 and an insulating layer 40 disposed on the substrate layer 20. The metal mesh touch electrode layer 100 further comprises a first metal layer 30 disposed on the substrate layer 20, a second metal layer 50 disposed on the insulating layer 40, and a conductive through hole 52 connected to the first metal layer 30 and the second metal layer 50. The first metal layer 30 and the second metal layer 50 are arranged in different layers.

The conductive through hole 52 is defined in the insulating layer 40. The second metal layer 50 is electrically connected to the first metal layer 30 through the conductive through hole 52, so that the drive electrodes 102 and the sensing electrodes 104 spaced apart from each other are electrically connected. The conductive through hole 52 and the second metal layer 50 are made of a same material. That is to say, the first metal layer 30 acts as a bridging metal and is electrically connected to the second metal layer 50 through the conductive through hole 52 to connect the drive electrodes (Tx) 102 or the sensing electrodes (Rx) 104.

Furthermore, the flexible substrate 10 comprises a flexible lining 11, an organic light emitting diode layer 12, and a thin film packaging layer 13 sequentially stacked on each other. The organic light emitting diode layer 12 comprises a plurality of sub-pixels 22 disposed spaced apart from each other. The metal mesh touch electrode layer 100 comprises a substrate layer 20, a first metal layer 30, an insulating layer 40, and a second metal layer 50 to form a touch metal line (see FIG. 2). The touch metal line is disposed between each adjacent two of the sub-pixels 22 so as to prevent illuminating light and brightness of the sub-pixels 22 from being blocked. As shown in FIG. 2, a width of the touch metal line ranges from 0.5 μm to 5 μm, thereby effectively reducing an area of the bridging metal and prevent the bridging metal from causing optical interference on a display screen.

The flexible substrate 10 referred to herein is preferably a thin film transistor (TFT) backplane, and the organic light emitting diode (OLED) layer 12 having the RGB sub-pixels 22 is disposed on the flexible substrate 11. The thin film packaging layer 13 is preferably a thin film encapsulation (TFE) layer 13 and is disposed on the OLED layer 12. The substrate layer 20 is preferably made of silicon nitride and is disposed on the thin film packaging layer 13. The touch metal line of the metal mesh touch electrode layer 100 preferably consists of a titanium-aluminum-titanium three-layered composite metal, or consists of other three-layered metal, such as titanium-aluminum-titanium or molybdenum-aluminum-molybdenum, which can prevent metal oxidation and enhance bending resistance of a touch control sensing circuit. The drive electrodes (drive lines) 102 and the sensing electrodes (sensing lines) 104 are separated by the insulating layer 40.

In the touch metal line shown in FIG. 3, the driving electrodes 102 and the sensing electrodes 104 are connected to a touch signal extraction pad 108 by a plurality of metal wires 106, respectively. The drive electrodes 102 are electrically connected to each other through the first metal layers (bridging metal) 30. The touch signal extraction pad 108 is connected to a driving signal line (not illustrated) of the display panel to output a touch control sensing signal.

Figure 4A:
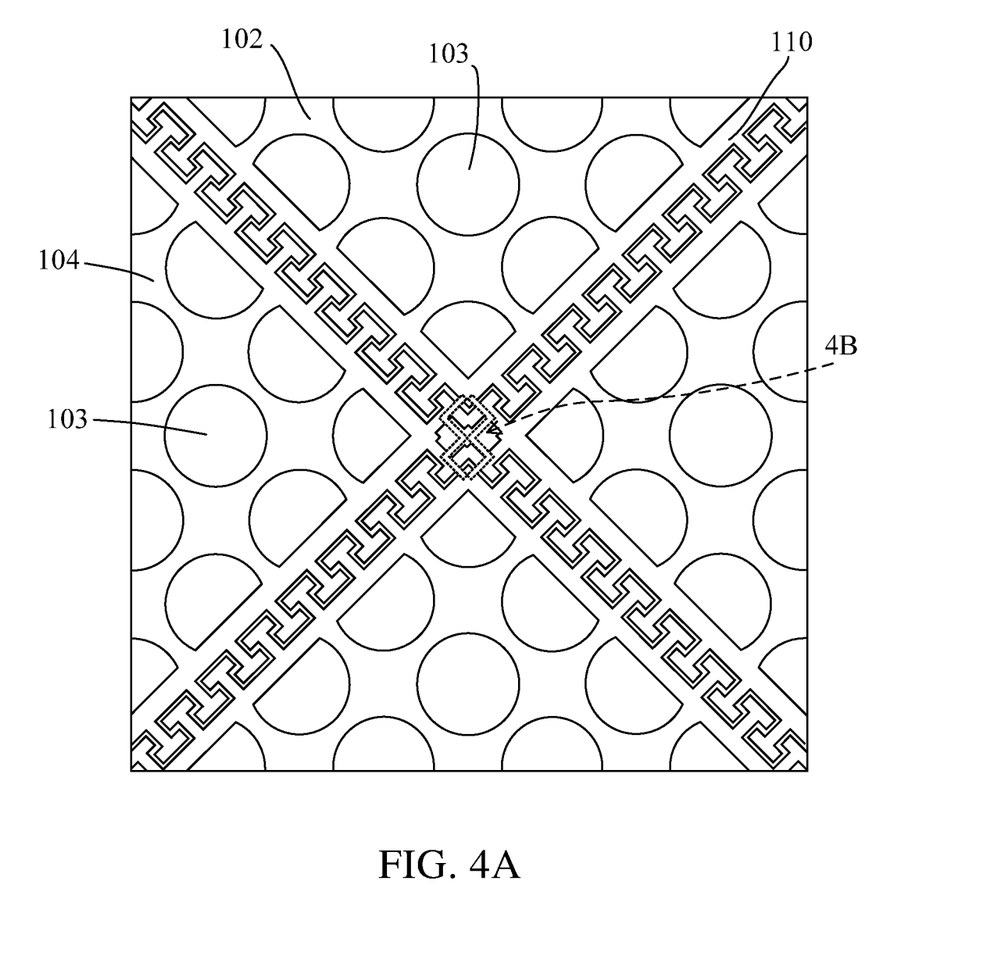
FIG. 4A is a schematic view illustrating T-shaped interaction regions between each drive electrode and each sensing electrode according to the present invention.
Figure 4B:
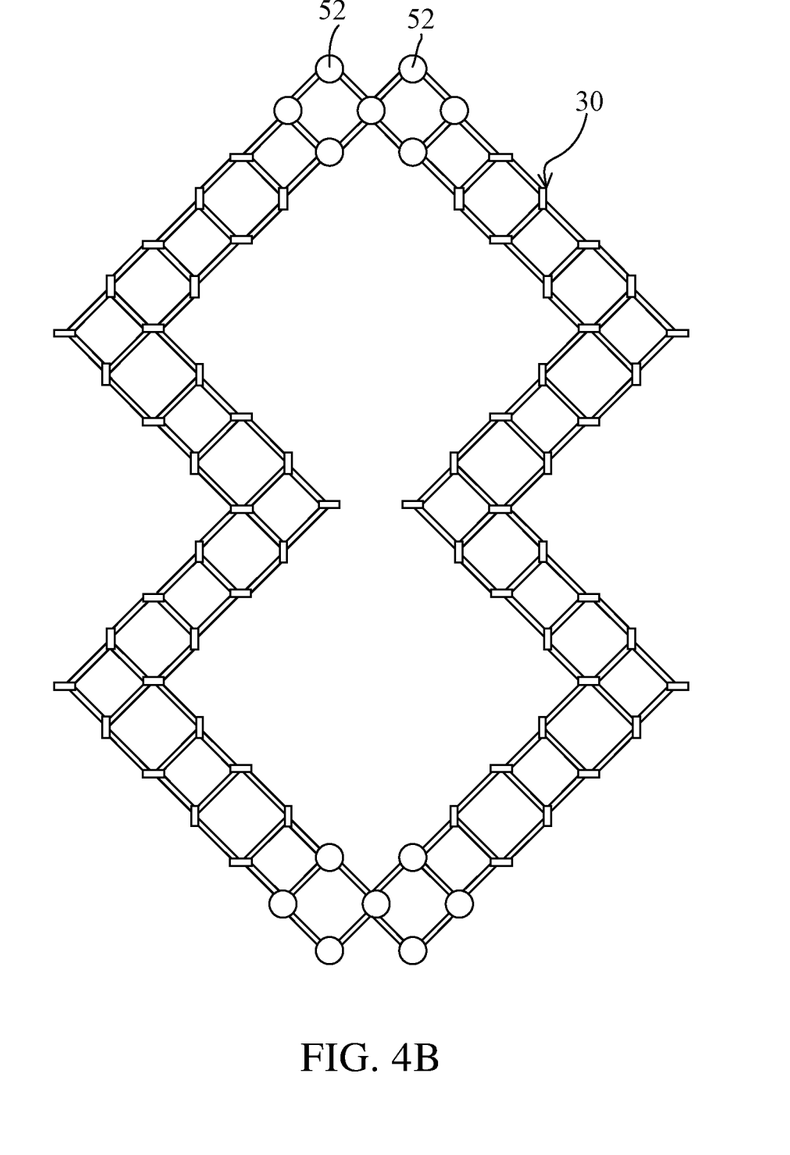
FIG. 4B is an enlarged view of portion 4B shown in FIG. 4A.
Figure 5:
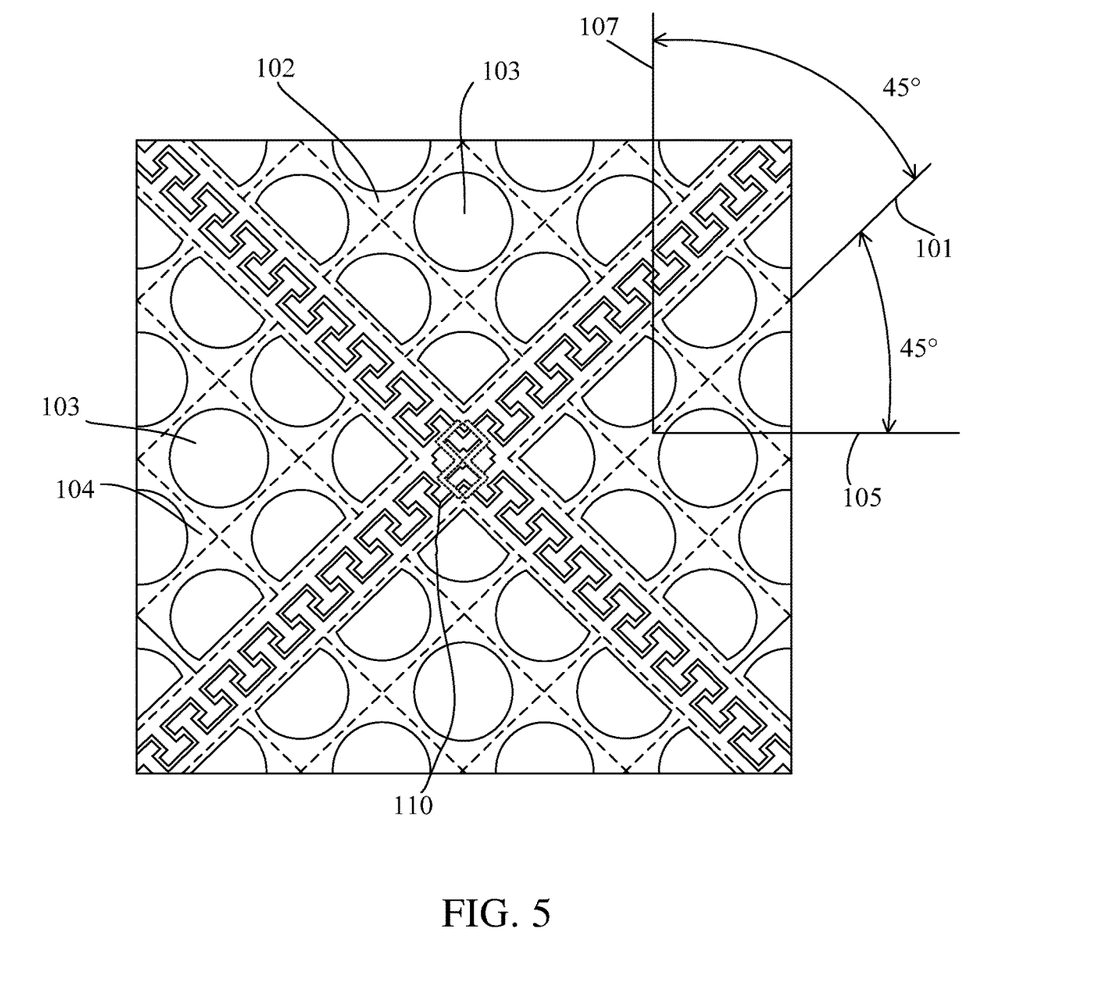
FIG. 5 is a schematic view illustrating a touch signal direction, a gate signal line direction, and a source/drain signal line direction of the metal mesh touch electrode layer.

Referring to FIGS. 4A, 4B, and 5, the floating electrodes 103 are linearly arranged at a specific angle in each of the drive electrodes 102 and each of the sensing electrodes 104, and the specific angle is 45 degrees or 135 degrees. In other words, a touch signal direction 101 (see dashed lines in FIG. 5) of the metal mesh touch electrode layer 100 forms an included angle of 45 degrees or 135 degrees with a gate signal line direction 105 and a source/drain signal line direction 107 of an organic light emitting diode layer 12. Therefore, overlapping between touch signals 101 of the metal mesh touch electrode layer 100 and the driving signals of the organic light emitting diode layer 12 is minimized.

Accordingly, this prevents, to the greatest extent, the touch signals from being interfered by the driving signals of the touch display panel, thereby enhancing stability and sensitivity of the touch control, and realizing flexible display touch control functions.

According to the present embodiment, each of the floating electrodes 103 is of an arc shape, a circular shape, a rectangular shape, or a hexagonal shape. According to one embodiment, a plurality of secondary floating electrodes (not illustrated) are disposed inside each of the floating electrodes 103, and the secondary floating electrodes are disposed spaced apart from each other. Specifically, according to the requirements of the interference signal, the secondary floating electrodes are formed by, for example, dividing the inside of each of the floating electrodes 103, so that the floating electrodes 103 of, for example, an arc shape, are further divided into independent secondary floating electrodes. Alternatively, the secondary floating electrodes are placed inside each of the floating electrodes 103, thereby reducing signal interference between the driving signals of the touch display panel and the touch signals 101.

As shown in FIG. 4A, a space between each of the drive electrodes 102 and each of the sensing electrodes 104 is provided with T-shaped interaction regions; however, in alternative embodiments, the space is provided with L-shaped interaction regions, or pulse matrix interaction regions to increase a touch control contact area between each of the drive electrodes 102 and each of the sensing electrodes 104. The T-shaped interaction regions 110, the L-shaped interaction regions or the pulse matrix interaction regions are electrically connected to each of the drive electrodes 102 and each of the sensing electrodes 104 through at least two conductive through holes 52.

As shown in FIG. 4B, in the case of the T-shaped interaction regions 110, a double-M-shaped bridging metal is used therein for connection. Eight interconnected conductive through holes 52 (there is one conductive through hole 52 overlapping another one) disposed at each of two ends of the bridging metal are connected to the second metal layer 50. The floating electrodes 103 are isolated from the drive electrodes 102 and the sensing electrodes 104 for shielding and dispersing interference signals or other noise signals of the organic light emitting diode layer 12 located under the floating electrodes 103, thereby effectively controlling a capacitance value and improving touch control sensitivity.

The present invention further provides a touch display device including a protective layer 60 (see FIG. 1) disposed on the metal mesh touch electrode layer 100. The touch display device includes the touch display panel of the foregoing embodiment. The protective layer 60 is disposed on the metal mesh touch electrode layer 100, and the protective layer 60 is preferably a glass cover or a scratch resistant film. The structure of the touch display panel is described in the foregoing embodiment, and therefore a detailed description is omitted herein for brevity.

Figure 6:
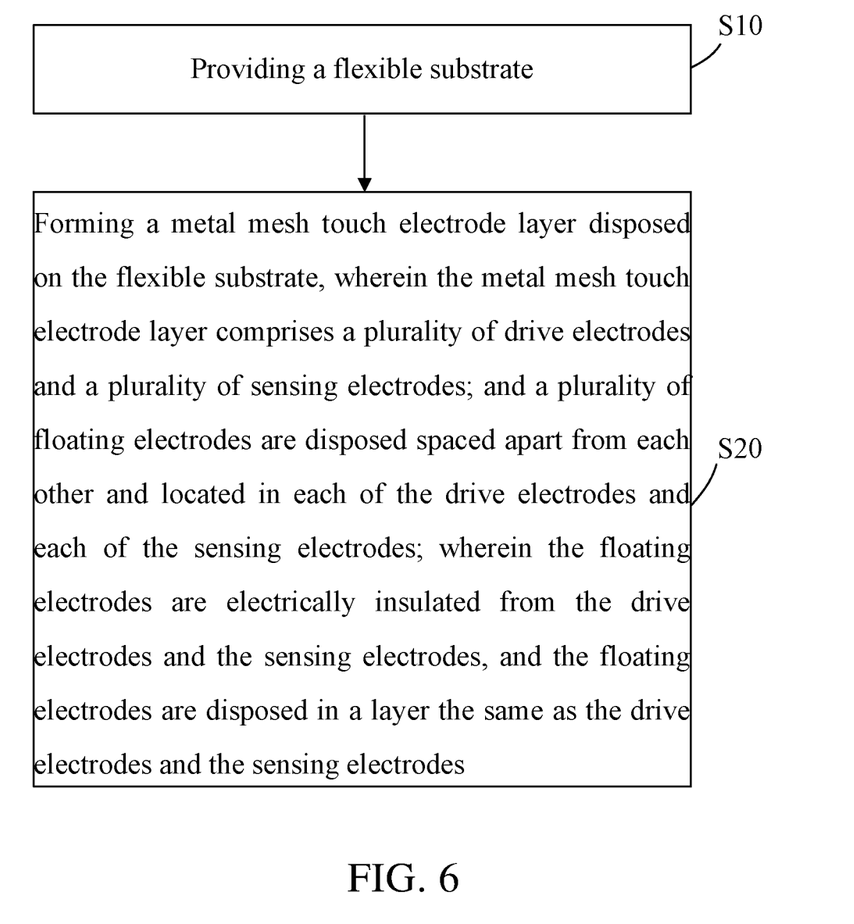
FIG. 6 is a process flow diagram illustrating a manufacturing method of a touch display panel according to the present invention.

Referring to FIG. 6, the present invention provides a manufacturing method of a touch display panel, comprising steps as follows.

S10: providing a flexible substrate 10; and

S20: forming a metal mesh touch electrode layer 100 disposed on the flexible substrate 10, wherein the metal mesh touch electrode layer 100 comprises a plurality of drive electrodes 102 and a plurality of sensing electrodes 104; and a plurality of floating electrodes 103 are disposed spaced apart from each other and located in each of the drive electrodes 102 and each of the sensing electrodes 103;

wherein the floating electrodes 103 are electrically insulated from the drive electrodes 102 and the sensing electrodes 104, and the floating electrodes 103 are disposed in a layer the same as the drive electrodes 102 and the sensing electrodes 104. The drive electrodes 102 and the sensing electrodes 104 are formed on the second metal layer 50 by, for example, etching, and form a metal mesh sensing pattern.

According to the present embodiment, the manufacturing method of the touch display panel further comprises steps as follows:

forming a substrate layer 20 on the flexible substrate 10;
forming a first metal layer 30 on the substrate layer 20;
forming an insulating layer 40 on the first metal layer 30; and
forming a second metal layer 50 on the insulating layer 40, wherein the first metal layer 30 and the second metal layer 50 are arranged in different layers, and the drive electrodes 102 and the sensing electrodes 104 are formed in the second metal layer 50.

When the second metal layer 50 is formed, the second metal layer 50 is etched to form a conductive through hole 52 which connects the first metal layer 30 and the second metal layer 50, so that the drive electrodes 102 and the sensing electrodes 104 are electrically connected.

Inside each floating electrode 103 are formed a plurality of secondary floating electrodes, and secondary floating electrodes are disposed spaced apart from each other. A touch signal direction 101 of the metal mesh touch electrode layer 100 forms an included angle of 45 degrees with a gate signal line direction 105 of the flexible substrate 10 and a source/drain (SD) signal line direction 107 of the flexible substrate 10, so that touch control signals are less interfered by driving signals of the touch display panel, touch control stability and sensitivity are enhanced, and a flexible touch control display is realized.

The touch display panel in the present embodiment can effectively prevent the driving signal of the AMOLED display panel from interfering the touch control sensing signal, improve the touch control sensitivity, and has a special touch sensing pattern by using, for example, an etching process, thereby simplifying a manufacturing process of the touch OLED display panel and reducing the thickness of the product.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A touch display panel, comprising:
a flexible substrate; and
a metal mesh touch electrode layer disposed on the flexible substrate, the metal mesh touch electrode layer comprising a plurality of drive electrodes and a plurality of sensing electrodes, a plurality of floating electrodes disposed spaced apart from each other and located in each of the drive electrodes and each of the sensing electrodes, wherein the floating electrodes are electrically insulated from the drive electrodes and the sensing electrodes, a space between each of the drive electrodes and each of the sensing electrodes is provided with T-shaped interaction regions, and the T-shaped interaction regions are electrically connected to each of the drive electrodes and each of the sensing electrodes through at least two conductive through holes.

2. The touch display panel according to claim 1, wherein the floating electrodes are linearly arranged at a specific angle in each of the drive electrodes and each of the sensing electrodes, and the specific angle is 45 degrees or 135 degrees.

3. The touch display panel according to claim 1, wherein each of the floating electrodes is of an arc shape, a circular shape, a rectangular shape, or a hexagonal shape.

4. The touch display panel according to claim 1, wherein a plurality of secondary floating electrodes are disposed inside each of the floating electrodes, and the secondary floating electrodes are disposed spaced apart from each other.

5. The touch display panel according to claim 1, wherein the space between each of the drive electrodes and each of the sensing electrodes is provided with L-shaped interaction regions or pulse matrix interaction regions to increase a touch control contact area, and the L-shaped interaction regions or the pulse matrix interaction regions are electrically connected to each of the drive electrodes and each of the sensing electrodes through at least two conductive through holes.

6. The touch display panel according to claim 1, wherein a touch signal direction of the metal mesh touch electrode layer forms an included angle of 45 degrees with a gate signal line direction of the flexible substrate and a source/drain (SD) signal line direction of the flexible substrate.

7. The touch display panel according to claim 1, wherein the touch display panel further comprises a substrate layer disposed on the flexible substrate and an insulating layer disposed on the substrate layer, wherein the metal mesh touch electrode layer comprises a first metal layer disposed on the substrate layer, a second metal layer disposed on the insulating layer, and a conductive through hole connected to the first metal layer and the second metal layer, and wherein the first metal layer and the second metal layer are arranged in different layers.

8. The touch display panel according to claim 7, wherein the conductive through hole is defined in the insulating layer; the second metal layer is electrically connected to the first metal layer through the conductive through hole, so that the drive electrodes and the sensing electrodes spaced apart from each other are electrically connected; and the conductive through hole and the second metal layer are made of a same material.

9. The touch display panel according to claim 1, wherein the flexible substrate comprises a flexible lining, an organic light emitting diode layer, and a thin film packaging layer sequentially stacked on each other; the organic light emitting diode layer comprises a plurality of sub-pixels disposed spaced apart from each other; a touch metal line of the metal mesh touch electrode layer is disposed between each adjacent two of the sub-pixels; and a width of the touch metal line ranges from 0.5 μm to 5 μm.

10. A touch display device, comprising:
a touch display panel, comprising:
a flexible substrate; and
a metal mesh touch electrode layer disposed on the flexible substrate, the metal mesh touch electrode layer comprising a plurality of drive electrodes and a plurality of sensing electrodes, a plurality of floating electrodes disposed spaced apart from each other and located in each of the drive electrodes and each of the sensing electrodes, wherein the floating electrodes are electrically insulated from the drive electrodes and the sensing electrodes, a space between each of the drive electrodes and each of the sensing electrodes is provided with T-shaped interaction regions, and the T-shaped interaction regions are electrically connected to each of the drive electrodes and each of the sensing electrodes through at least two conductive through holes; and
a protective layer disposed on the metal mesh touch electrode layer.

11. The touch display device according to claim 10, wherein the floating electrodes are linearly arranged at a specific angle in each of the drive electrodes and each of the sensing electrodes, and the specific angle is 45 degrees or 135 degrees.

12. The touch display device according to claim 10, wherein each of the floating electrodes is of an arc shape, a circular shape, a rectangular shape, or a hexagonal shape, a plurality of secondary floating electrodes are disposed inside each of the floating electrodes, and the secondary floating electrodes are disposed spaced apart from each other.

13. The touch display device according to claim 10, the space between each of the drive electrodes and each of the sensing electrodes is provided with L-shaped interaction regions or pulse matrix interaction regions to increase a touch control contact area, and the L-shaped interaction regions or the pulse matrix interaction regions are electrically connected to each of the drive electrodes and each of the sensing electrodes through at least two conductive through holes.

14. The touch display device according to claim 10, wherein the touch display panel further comprises a substrate layer disposed on the flexible substrate and an insulating layer disposed on the substrate layer; the metal mesh touch electrode layer comprises a first metal layer disposed on the substrate layer, a second metal layer disposed on the insulating layer, and a conductive through hole connected to the first metal layer and the second metal layer; the first metal layer and the second metal layer are arranged in different layers; the conductive through hole is defined in the insulating layer; the second metal layer is electrically connected to the first metal layer through the conductive through hole, so that the drive electrodes and the sensing electrodes spaced apart from each other are electrically connected; and the conductive through hole and the second metal layer are made of a same material.

15. The touch display device according to claim 10, wherein the flexible substrate comprises a flexible lining, an organic light emitting diode layer, and a thin film packaging layer sequentially stacked on each other; the organic light emitting diode layer comprises a plurality of sub-pixels disposed spaced apart from each other; a touch metal line of the metal mesh touch electrode layer is disposed between each adjacent two of the sub-pixels; and a width of the touch metal line ranges from 0.5 μm to 5 μm.

16. A manufacturing method of a touch display panel, comprising steps as follows:
S10: providing a flexible substrate; and
S20: forming a metal mesh touch electrode layer disposed on the flexible substrate, wherein the metal mesh touch electrode layer comprises a plurality of drive electrodes and a plurality of sensing electrodes; and a plurality of floating electrodes are disposed spaced apart from each other and located in each of the drive electrodes and each of the sensing electrodes;
wherein the floating electrodes are electrically insulated from the drive electrodes and the sensing electrodes, a space between each of the drive electrodes and each of the sensing electrodes is provided with T-shaped interaction regions, and the T-shaped interaction regions are electrically connected to each of the drive electrodes and each of the sensing electrodes through at least two conductive through holes.

17. The manufacturing method of the touch display panel according to claim 16, further comprising steps as follows:
forming a substrate layer on the flexible substrate;
forming a first metal layer on the substrate layer;
forming an insulating layer on the first metal layer; and
forming a second metal layer on the insulating layer, wherein the first metal layer and the second metal layer are arranged in different layers, and the drive electrodes and the sensing electrodes are formed in the second metal layer.

18. The manufacturing method of the touch display panel according to claim 17, wherein when the second metal layer is formed, the second metal layer is etched to form a conductive through hole which connects the first metal layer and the second metal layer, so that the drive electrodes and the sensing electrodes are electrically connected.

19. The manufacturing method of the touch display panel according to claim 16, wherein inside each of the floating electrodes are formed a plurality of secondary floating electrodes, and the secondary floating electrodes are disposed spaced apart from each other.

20. The manufacturing method of the touch display panel according to claim 16, wherein a touch signal direction of the metal mesh touch electrode layer forms an included angle of 45 degrees with a gate signal line direction of the flexible substrate and a source/drain (SD) signal line direction of the flexible substrate.

* * * * *